(12) United States Patent
Murakami et al.

(10) Patent No.: US 6,858,804 B2
(45) Date of Patent: Feb. 22, 2005

(54) CABLE-ENROLLING CONDUCTIVE THIN-FILM SHEET AND MANUFACTURING METHOD THEREOF

(75) Inventors: Kazuhiro Murakami, Shizuoka (JP); Yoshihiko Watanabe, Shizuoka (JP); Akira Baba, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/995,803

(22) Filed: Nov. 29, 2001

(65) Prior Publication Data

US 2002/0096358 A1 Jul. 25, 2002

(30) Foreign Application Priority Data

Jan. 19, 2001 (JP) ........................................ 2001-011895

(51) Int. Cl.[7] .............................................. H01R 4/00
(52) U.S. Cl. .................................................... 174/84 R
(58) Field of Search ............................. 74/84 R, 88 R, 74/117 F, 117 FF, 92; 439/492, 494

(56) References Cited

U.S. PATENT DOCUMENTS

| | | | | |
|---|---|---|---|---|
| 4,249,304 A | * | 2/1981 | Weinmann et al. ............ | 29/872 |
| 4,707,914 A | * | 11/1987 | Schauer ........................ | 29/872 |
| 5,584,122 A | * | 12/1996 | Kato et al. ..................... | 29/872 |
| 5,642,852 A | * | 7/1997 | Suzuki et al. ............. | 228/110.1 |
| 5,869,784 A | * | 2/1999 | Shinchi ..................... | 174/84 R |
| 5,922,993 A | * | 7/1999 | Ide et al. ................... | 174/84 R |
| 5,925,202 A | * | 7/1999 | Ide et al. ................... | 156/73.2 |
| 5,929,384 A | * | 7/1999 | Ide et al. ................... | 174/84 R |
| 5,959,252 A | * | 9/1999 | Ide et al. ................... | 174/84 R |
| 6,004,170 A | * | 12/1999 | Kato et al. ................... | 439/874 |
| 6,023,022 A | * | 2/2000 | Nakamura et al. ......... | 174/88 R |
| 6,046,407 A | * | 4/2000 | Ide .............................. | 174/78 |
| 6,072,123 A | * | 6/2000 | Ide et al. ...................... | 174/78 |
| 6,087,589 A | * | 7/2000 | Ide .............................. | 174/78 |
| 6,201,188 B1 | * | 3/2001 | Ide ........................... | 174/84 R |
| 6,226,865 B1 | * | 5/2001 | Tanikawa et al. ............. | 29/872 |
| 6,247,977 B1 | * | 6/2001 | Tanaka et al. ............... | 439/874 |
| 6,291,771 B1 | * | 9/2001 | Tanikawa et al. ......... | 174/84 R |
| 6,313,407 B1 | * | 11/2001 | Shinchi et al. ............ | 174/84 R |
| 6,327,777 B1 | * | 12/2001 | Ide et al. ...................... | 29/868 |
| 6,376,773 B1 | * | 4/2002 | Maegawa ................. | 174/88 R |
| 6,381,840 B2 | * | 5/2002 | Ide .............................. | 29/872 |

FOREIGN PATENT DOCUMENTS

| | | | | |
|---|---|---|---|---|
| JP | 05-1211139 A | * | 5/1993 | .......... H01R/43/02 |
| JP | 07-263050 A | * | 10/1995 | ............ H01R/9/07 |

* cited by examiner

*Primary Examiner*—William H. Mayo, III
(74) *Attorney, Agent, or Firm*—Armstrong, Kratz, Quintos, Hanson & Brooks, LLP

(57) ABSTRACT

The cable-enrolling conductive thin-film sheet 1 consists of a conductive thin film 2 and an insulated cable 3. The conductive thin film 2 has a conductor layer 4 and first and second insulating layers 5, 6. The first insulating layer 5 is laminated on one face of the conductor layer 4, while the second insulating layer 6 is laminated on the other face of the conductor layer 4. The insulated cable 3 has an electrically conductive core wire 10 and an insulating sheath 11 covering the core wire 10. The insulated cable 3 laid on the first insulating layer 5 is partially welded to the sheet 2 by ultrasonic welding to obtain the cable-enrolling conductive thin-film sheet 1. The first insulating layer 5 is welded to be secured to the sheath 11, and the conductor layer 4 is mechanically connected to the core wire 10 by the ultrasonic welding.

10 Claims, 1 Drawing Sheet

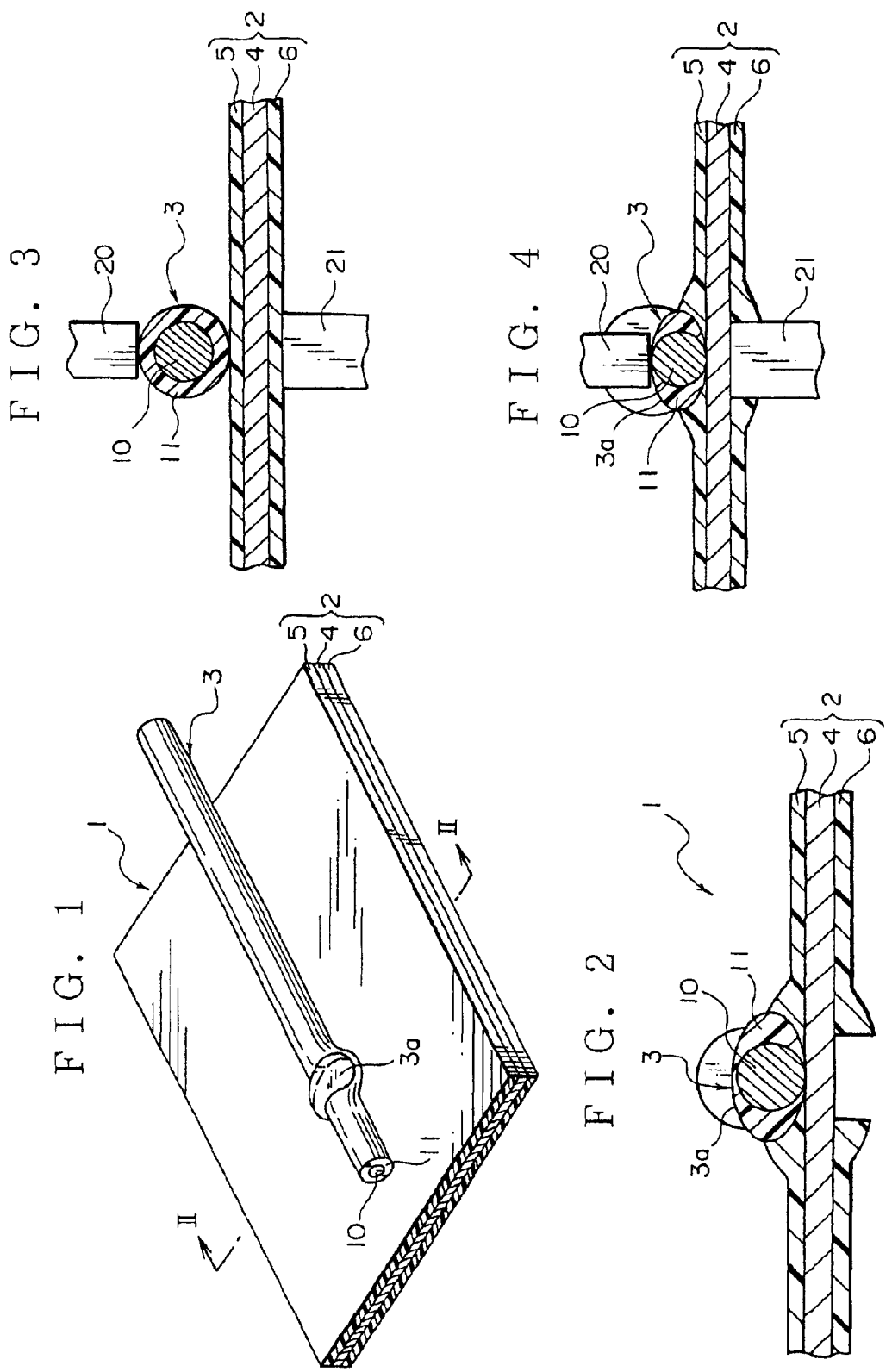

CABLE-ENROLLING CONDUCTIVE THIN-FILM SHEET AND MANUFACTURING METHOD THEREOF

BACKGROUND OF THE INVENTION

1. Field of the Invention

The present invention relates to a cable-enrolling conductive thin-film sheet and a manufacturing method of the same. The sheet has a conductor layer sandwiched by a pair of insulating layers, and the conductor layer is connected to a core wire of an electrical cable.

2. Related Art

A motorcar is arranged with wiring harnesses for supplying an electrical power from a power source like a battery to electric equipment such as various types of lamps and motors and for transmitting control signals from a control unit to the electric equipment. Each wiring harness has a plurality of electrical cables.

Some of the electrical cables are shielded to prevent invasion of external electronic noises. The shield electrical cable has a shielding sheath having a knitted electrically conductive layer for preventing the invasion of the noises into the core wire.

Recently, a production cost reduction of a wiring harness has been desired. For the purpose, it has been proposed that a plurality of non-shielded electrical cables are made up into a bundle thereof and enrolled by a conductive thin film having a conductor layer to compose a wiring harness. This achieves a cost reduction of the wiring harness with prevention of noise invasion. Even in this configuration, the conductor layer needs to connect to a ground to remove the noises.

The aforementioned conductive thin-film sheet preferably has a pair of synthetic resin insulating layers each laminated on a front or rear face of the conductor layer. This eliminates pinholes generated due to corrosion of the conductor layer. The conductive thin-film sheet is partially stripped to connect the conductor layer to an end of a ground cable. Thereafter, the conductive thin film and the ground cable are secured to a support with bolts, nuts, washers, etc.

The stripping process of a portion of a sheath of the ground cable is required, thereby increasing a man hour in assembling thereof. The number of parts including bolts, nuts, and washers increases, resulted in an increased production cost of the conductive thin-film sheet. Moreover, the fastening of the bolts and nuts may cause a damage of the conductor layer not to establish a reliable electrical connection of the ground cable to the conductor layer. This is disadvantageous for removing external noises entering the core wire of the electrical cable.

SUMMARY OF THE INVENTION

In view of the above-mentioned disadvantages, an object of the present invention is to provide a cable-enrolling conductive thin-film sheet and a manufacturing method of the same, in which a conductive thin-film layer is reliably connected to an electrical cable with a lower assembling cost.

For achieving the object, a basic aspect of the invention is a cable-enrolling conductive thin-film sheet which includes:

a conductive thin film having a conductor layer, a first insulating layer laminated on a front face of the conductor layer, and a second insulating layer laminated on a rear face of the conductor layer; and an electrical cable having an electrically conductive core wire and an insulating sheath covering the core wire, wherein the conductor layer of the conductive thin film and the core wire of the electrical cable are welded to each other.

Such electrical connection between the conductor layer of the conductive thin film and the core wire of the electrical cable decreases parts in number as compared with the above-mentioned conventional art. The welding of the core wire to the conductor layer enables a sure electrical connection between the conductor layer and the electrical cable.

Preferably, a portion of one of the first and second insulation layers is welded to the sheath of the electrical cable. This improves a mechanical connection between the conductor layer and the core wire. Accordingly, with a reduced manufacturing cost, the conductor layer of the conductive thin film is reliably connected to the electrical cable.

According to a further feature of the present invention, a manufacturing method of the cable-enrolling conductive thin-film sheet includes the steps of:

laying the electrical cable on one of the first and second insulation layers; and welding the electrical cable on the one of the insulating layers by ultrasonic welding so that the conductor layer of the conductive thin film can be welded to the core wire of the electrical cable.

Thus, the ultrasonic welding of the insulating layer of the conductive thin film with the sheath of the electrical cable eliminates a stripping process of the sheath. This also eliminates another stripping process of a portion of the first or second insulating layer, allowing a reduced assembling man-hour. The ultrasonic welding of the conductor layer to the core wire decreases parts in number to fit the conductive thin film to the electrical cable. Accordingly, a reduced finishing cost of the cable-enrolling conductive thin-film sheet is achieved.

Moreover, the ultrasonic welding decreases parts in number to secure the electrical cable to the conductive thin film. Heat generated by the ultrasonic welding melts the insulating layer of the conductive thin film and the sheath of the electrical cable. This improves a mechanical connection between the conductor layer and the core wire. Accordingly, the conductor layer of the conductive thin film is reliably connected to the electrical cable.

During the ultrasonic welding, a force for pressing the electrical cable against conductive thin film may be constant or variable.

BRIEF DESCRIPTION OF THE DRAWINGS

FIG. 1 is a perspective view showing a cable-enrolling conductive thin-film sheet of an embodiment according to the present invention;

FIG. 2 is a cross-sectional view taken along line II-II of FIG. 1;

FIG. 3 is a cross-sectional view showing an insulated cable and a conductive thin film of the embodiment, which are in a state before the combination thereof; and FIG. 4 is a cross-sectional view of the insulated cable and the conductive thin film, which are in a state after the combination thereof.

DETAILED DESCRIPTION OF THE PREFERRED EMBODIMENT

Referring to FIGS. 1 to 4, a cable-enrolling conductive thin-film sheet of an embodiment according to the present invention will be discussed. As illustrated in FIGS. 1 and 2, a cable-enrolling conductive thin-film sheet 1 consists of a conductive thin film 2 and an insulated cable 3.

The conductive thin film 2 has a thin conductor layer 4, a thin first insulating layer 5, and a thin second insulating layer 6. The conductor layer 4 is flexible and made of an electrically conductive metal. The conductor layer 4 has a uniform thickness.

The first insulating layer 5 is made of an insulating synthetic resin material and is laminated on one face of the conductor layer 4. The second insulating layer 6 is also made of an insulating synthetic resin material and is laminated on another face of the conductor layer 4. The first and second insulating layers 5, 6 are flexible.

The insulated cable 3 has a generally round section. The insulated cable 3 consists of a core wire 10 having a generally round section and a sheath 11 covering the core wire 10. The core wire 10 is a single electrically conductive wire or consists of a plurality of electrically conductive twisted wires. The conductors of the core wire 10 are made of an electrically conductive metal. The core wire 10 is flexible, and the sheath 11 is made of an insulating flexible synthetic resin.

The sheath 11 of the insulated cable 3 sheet 1 is welded to one of the insulating layers 5, 6 at a portion 3a of the insulated cable 3. Also, the core wire 10 is mechanically connected to the conductor layer 4 near the portion 3a of the insulated cable 3. In the illustrated embodiment, the sheath 11 is welded to the first insulating layer 5.

The portion 3a of the insulated cable 3 is secured to the conductive thin film 2 by utilizing an ultrasonic welding machine. In the illustrated embodiment, the portion 3a is an end of the insulated cable 3.

The ultrasonic welding machine, as illustrated in FIGS. 3, 4, has a horn tip 20, an anvil 21 opposed to the horn tip 20, an oscillator (not shown), a transducer, a horn, etc. The ultrasonic welding machine pinches a welding object between the horn tip 20 and the anvil 21 with a pressure force exerted on the object. The oscillator moves the transducer so that the generated oscillations are delivered to the horn tip 20. Thus, the ultrasonic welding machine applies ultrasonic oscillations to the object pinched between the horn tip 20 and the anvil 21 to weld the object.

For securing the insulated cable 3 to the conductive thin film 2 to complete the cable-enrolling conductive thin-film sheet 1, first, the horn tip 20 and the anvil 21 receive the conductive thin film 2 with the insulated cable 3 therebetween as illustrated in FIG. 3. The conductive thin film 2 is put on the anvil 21, and the insulated cable 3 contacts the horn tip 20, The anvil 21 contacts the second insulating layer 6, and the insulated cable 3 is laid on the first insulating layer 5.

Then, the horn tip 20 and the anvil 21 are moved toward each other to press the sandwiched object. Next, the oscillator moves the transducer so that the generated oscillations are delivered to the horn tip 20. This creates oscillations between the conductive thin film 2 and the insulated cable 3, so that the first insulating layer 5 and the sheath 11 melt at the portion 3a.

Since the horn tip 20 and the anvil 21 are pressed to come close to each other, the insulating layer 5 and the sheath 11 are partially removed at the portion 3a due to the melting of the first insulating layer 5 and the sheath 11. Thereby, the conductor layer 4 and the core wire 10 can contact each other at the portion 3a. The ultrasonic oscillations can mechanically connect the conductor layer 4 to the core wire 10.

Thus, the conductor layer 4 and the core wire 10 are welded to each other by a so-called ultrasonic welding (or ultrasonic bonding). Then, the transducer is stopped, the horn tip 20 and the anvil 21 are moved apart from each other. The melting of the first insulating layer 5 and the sheath 11 welds them to each other at the portion 3a. Thus, the insulating layer 7 and the sheath 11 are partially welded to each other, and the conductor layer 4 is connected to the core wire 10 to obtain the cable-enrolling conductive thin-film sheet 1.

Thus obtained sheet 1 can have a plurality of the electrical cables which are overlapped by the conductive thin film 2. This electrically shields the cables, without usage of additional resin material at the overlapping portion, and the insulated cables are connected to a desired ground circuit.

In the embodiment, the ultrasonic welding connects the conductor layer 4 to the core wire 10, enabling a man hour reduction in fitting the conductive thin film 2 to the insulated cable 3 and a reduction of parts in number as compared with the aforementioned conventional art. Thus, the cable-enrolling conductive thin-film sheet 1 is less in a manufacturing cost thereof.

As described above, the ultrasonic welding of the sheath 11 of the insulated cable 3 laid on the first insulating layer 5 partially removes the sheath 11 and the first insulating layer 5 to expose the core wire 10 and the conductor layer 4. An additional step for partially removing the sheath 11 and the first insulating layer 5 at the portion of 3a of the insulated cable is not required for fitting the insulated cable 3 to the conductive thin film 2.

That is, no stripping process of the insulated cable 3 is needed, allowing a decreased man-hour for fitting to the insulated cable 3 to the conductive thin film 2. This achieves a reduced producing cost of the cable-enrolling conductive thin-film sheet 1.

The ultrasonic welding of the conductor layer 4 to the core wire 10 simultaneously welds the first insulating layer 5 to the sheath 11. This achieves a more reliable mechanical connection of the conductor layer 4 and the core wire 10 as compared with a conventional method like wire bonding thereof. Accordingly, the insulated cable 3 is surely secured to the conductive thin film 2.

Since the insulated cable 3 has a round section, the pressure force of the horn tip 20 toward the anvil 21 concentrates at a desired contact portion of the conductive thin film 2 and the insulated cable 3. This enables a quick removal of the melted parts of the first insulating layer 5 and the sheath 11 between the conductor layer 4 and the core wire 10. Thus, the core wire 10 is easily connected to the conductor layer 4, and the insulated cable 3 is surely secured to the conductive thin film 2.

What is claimed is:

1. A cable-enrolling conductive thin-film sheet comprising:
    a conductive thin film having a conductor layer, a first insulating layer laminated on a front face of the conductor layer, and a second insulating layer laminated on a rear face of the conductor layer; and
    an electrical cable having an electrically conductive core wire and an insulating sheath covering the core wire, the sheath having a round section,
    wherein the conductor layer of the conductive thin film and the core wire of the electrical cable are welded to each other, and one of said first and second insulating layers of the conductive thin film overlaps the electrical cable to electrically shield the electrical cable, without usage of additional resin material at the overlapping portion.

2. The sheet as claimed in claim 1 wherein the electrical cable is grounded.

3. A manufacturing method of the cable-enrolling conductive thin-film sheet as defined in claim 1 comprising the steps of:
   laying the electrical cable on one of the first and second insulation layers; and
   welding the electrical cable on the one of the insulating layers by ultrasonic welding so that the conductor layer of the conductive thin film can be connected to the core wire of the electrical cable.

4. A manufacturing method of the cable-enrolling conductive thin-film sheet as claimed in claim 1 comprising the steps of:
   laying the electrical cable on one of the first and second insulation layers; and
   welding the electrical cable on the one of the insulating layers by ultrasonic welding so that the conductor layer of the conductive thin film can be welded to the core wire of the electrical cable.

5. The method as claimed in claim 4 wherein the one of the insulating layers is welded to the sheath of the electrical cable during the step of the ultrasonic welding.

6. The method as claimed in claim 4 wherein, in the step of ultrasonic welding, a horn tip is opposed to the electrical cable, and an anvil is opposed to the other of the first and second insulating layers of the conductive thin film.

7. The method as claimed in claim 6 wherein, in the step of ultrasonic welding, the horn tip and the anvil are moved to come close to each other.

8. The method as claimed in claim 7 wherein, in the step of ultrasonic welding, the horn tip contacts the sheath of the electrical cable, and the anvil contacts the other of the first and second insulating layers of the sheet.

9. The sheet as claimed in claim 1 wherein a portion of said one of the first and second insulating layers is welded to the sheath of the electrical cable.

10. A cable-enrolling conductive thin-film sheet comprising:
   a conductive thin film having a conductor layer, a first insulating layer laminated on a front face of the conductor layer, and a second insulating layer laminated on a rear face of the conductor layer; and
   a plurality of the electrical cables each having an electrically conductive core wire and an insulating sheath covering the core wire, the sheath having a round section,
   wherein the conductor layer of the conductive thin film and the core wire of one of the electrical cables are welded to each other, and one of said first and second insulating layers of the conductive thin film overlaps the electrical cables to electrically shield the electrical cables, without usage of additional resin material at the overlapping portion.

* * * * *